United States Patent
Wang

(10) Patent No.: US 12,484,453 B2
(45) Date of Patent: Nov. 25, 2025

(54) METHOD FOR FABRICATING MAGNETORESISTIVE RANDOM ACCESS MEMORY

(71) Applicant: UNITED MICROELECTRONICS CORP., Hsin-Chu (TW)

(72) Inventor: Hui-Lin Wang, Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 689 days.

(21) Appl. No.: 17/887,486

(22) Filed: Aug. 14, 2022

(65) Prior Publication Data

US 2024/0023455 A1  Jan. 18, 2024

(30) Foreign Application Priority Data

Jul. 14, 2022 (TW) ................................. 111126449

(51) Int. Cl.
*H10N 50/01* (2023.01)
*H10B 61/00* (2023.01)
*H10N 50/80* (2023.01)

(52) U.S. Cl.
CPC ............. *H10N 50/01* (2023.02); *H10B 61/00* (2023.02); *H10N 50/80* (2023.02)

(58) Field of Classification Search
CPC ........ H10N 50/01; H10N 50/80; H10N 50/10; H10B 61/00; H10B 61/22
See application file for complete search history.

(56) References Cited

U.S. PATENT DOCUMENTS

| | | | |
|---|---|---|---|
| 11,264,557 B2 | 3/2022 | Kardasz et al. | |
| 2010/0219491 A1* | 9/2010 | Lee | H10N 50/01 700/121 |
| 2019/0207091 A1* | 7/2019 | Kardasz | H01F 10/3286 |
| 2021/0111338 A1* | 4/2021 | Xue | H10N 50/80 |
| 2023/0067295 A1* | 3/2023 | Guo | H01F 10/329 |

FOREIGN PATENT DOCUMENTS

| | | |
|---|---|---|
| CN | 107039582 A | 8/2017 |
| CN | 109643754 A | 4/2019 |
| EP | 3472875 B1 | 10/2020 |
| TW | 202137579 A | 10/2021 |

* cited by examiner

*Primary Examiner* — Shih Tsun A Chou
(74) *Attorney, Agent, or Firm* — Winston Hsu

(57) ABSTRACT

A method for fabricating semiconductor device includes the steps of first forming a bottom electrode on a substrate, forming a magnetic tunneling junction (MTJ) on the bottom electrode, and then forming a cap layer on the MTJ. Preferably, the formation of the cap layer could be accomplished by the following steps: (a) forming a first metal layer on the MTJ; (b) forming a second metal layer on the first metal layer; and (c) performing an oxidation process.

8 Claims, 4 Drawing Sheets

(a) Forming a first metal layer on the MTJ (b) Forming a second metal layer on the first metal layer (c) Performing an oxidation process (d) Performing an anneal process

METHOD FOR FABRICATING MAGNETORESISTIVE RANDOM ACCESS MEMORY

BACKGROUND OF THE INVENTION

1. Field of the Invention

The invention relates to a method for fabricating semiconductor device, and more particularly to a method for fabricating a magnetoresistive random access memory (MRAM) device.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first forming a bottom electrode on a substrate, forming a magnetic tunneling junction (MTJ) on the bottom electrode, and then forming a cap layer on the MTJ. Preferably, the formation of the cap layer could be accomplished by the following steps: (a) forming a first metal layer on the MTJ; (b) forming a second metal layer on the first metal layer; and (c) performing an oxidation process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
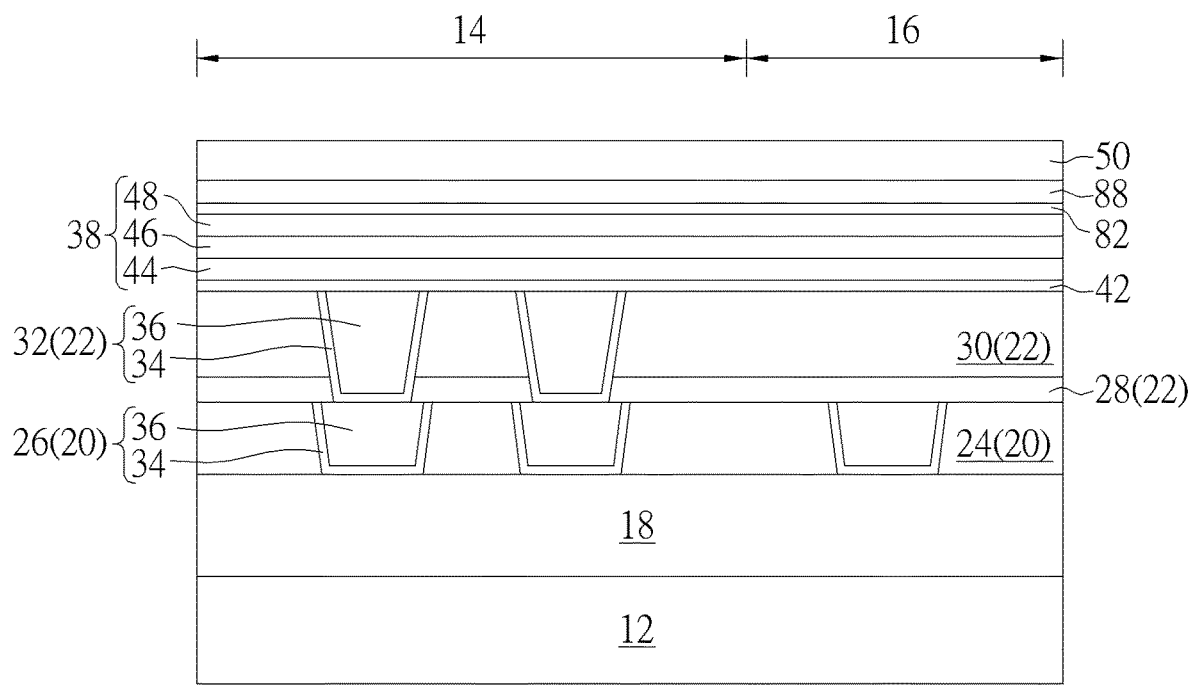
FIGS. 1-7 illustrate a method for fabricating a MRAM device according to an embodiment of the present invention.

Referring to FIGS. 1-7, FIGS. 1-7 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a cap layer 82, a cap layer 88, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode 42 and the top electrode 50 are preferably made of conductive material including but not limited to for example Ta, TaN, Pt, Cu, Au, Al, ruthenium (Ru), or combination thereof and more specifically in this embodiment, the bottom electrode 42 is made of TaN while the top electrode is made of ruthenium (Ru). The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
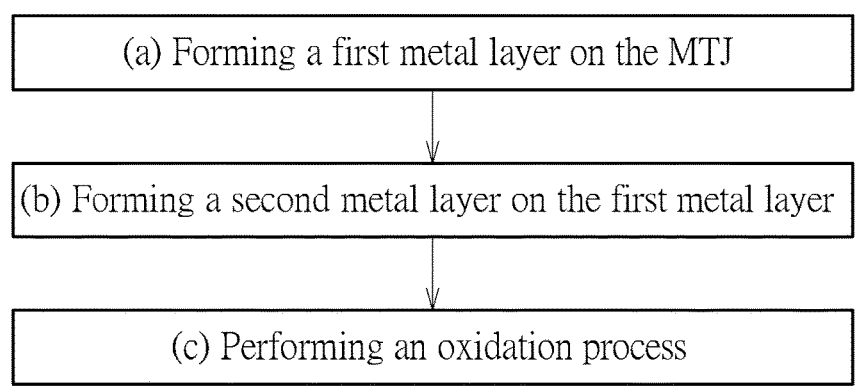
Figure 3:
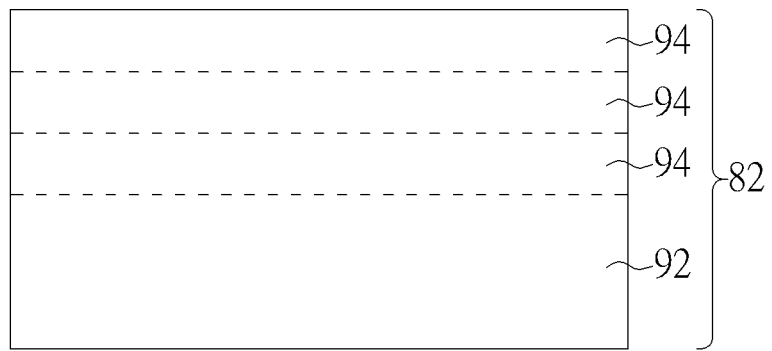

In this embodiment, the cap layer 82 disposed on top of the MTJ stack 28 preferably includes metal oxide such as MgO and the cap layer 88 preferably includes metal such as Ta. Referring to FIGS. 2-3, FIG. 2 illustrates a flow chart for fabricating the cap layer 82 according to an embodiment of the present invention and FIG. 3 illustrates a perspective view for forming the cap layer 82 on the MTJ stack 38 according to FIG. 2. As shown in FIGS. 2-3, step (a) could be first conducted to form a first metal layer 92 on the MTJ stack 38, step (b) could be conducted to form a second metal layer 94 on the first metal layer 92, and then step (c) could be conducted to perform an oxidation process to transform the first metal layer 92 and the second metal layer 94 into the cap layer 82, in which steps (b) and (c) are preferably conducted at the same time, step (b) and step (c) are repeated n times after steps (b) and (c) are conducted as n>=2. In other word, after the initial first metal layer 92 is formed on the surface of the MTJ stack 38 through sputtering process, multiple sputtering processes used to form the second metal layer 94 are conducted to form two or more second metal layers 94 on the surface of the first metal layer 92 as an oxidation process is also conducted during the formation of each new second metal layer 94. For instance, as shown in FIG. 3, it would be desirable to conduct three sputtering processes for forming three second metal layers 94 on the surface of the first metal layer 92 and each of the second metal layers 94 is accompanied by an oxidation process when a new layer of second metal layer 94 is formed. After steps (b) and (c) are repeated multiple times, all of the first metal layer 92 and the second metal layer 94 are preferably converted into the cap layer 82 made of metal oxide.

In this embodiment, the first metal layer 92 and the second metal layer 94 are preferably made of same material such as magnesium (Mg) and the oxidation process preferably converts the first metal layer 92 and the second metal layer 94 into the cap layer 82 made of MgO. Moreover, each of the second metal layers 94 could have same or different thicknesses while the thickness of each of the second metal layers 94 is less than the thickness of the first metal layer 92. For instance, the thickness of the initial first metal layer 92 is preferably between 1-5 Angstroms and the thickness of each of the second metal layers 94 is between 2-3 Angstroms. As shown in FIG. 3, the cap layer 82 could include a single layer of first metal layer 92 and a plurality of second metal layers 94 such as three layers of second metal layer 94, in which the second metal layers 94 could have same or different thicknesses therebetween and the thickness of each of the second metal layers 94 is less than the thickness of the first metal layer 92. It should be noted that to simplify the overall structure, only a single layer of cap layer 82 is shown in FIG. 1 despite the cap layer 82 is in fact a multi-layer structure made of a first metal layer 92 and multiple second metal layers 94.

Figure 4:
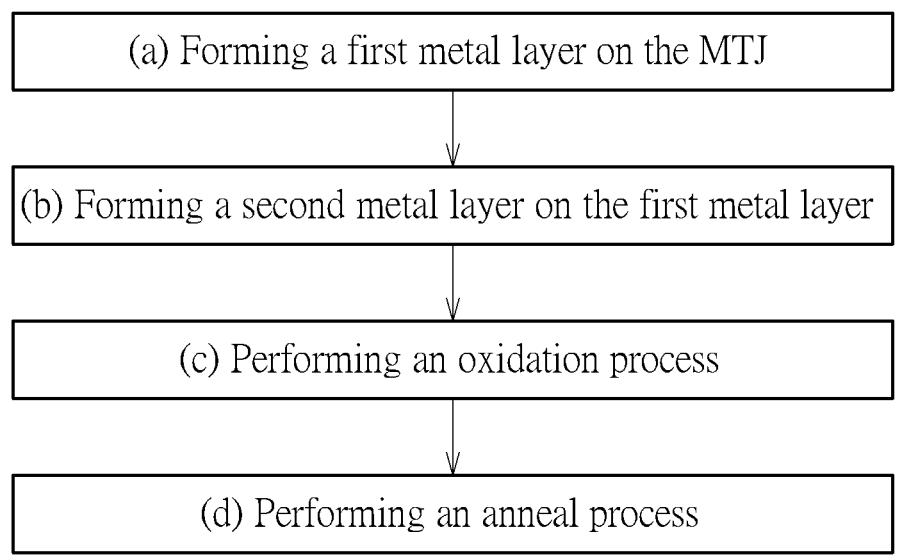

Next, referring to FIG. 4, FIG. 4 illustrates a flow chart for fabricating the cap layer 82 according to an embodiment of the present invention. As shown in FIG. 4, in contrast to only repeating the steps (b) and (c) after step (a) as disclosed in the embodiment shown in FIG. 2, it would be desirable to conduct an additional step (d) of performing an anneal process after steps (b) and (c) are completed, in which the process could be accomplished by repeating steps (b), (c), and (d) n times and n>=2 after step (a) is completed or first conducting step (a), repeating steps (b) and (c) n times and n>=2, and then conducting step (d) only once afterwards, these variations are all within the scope of the present invention.

In other words, after forming the initial first metal layer 92 on the surface of the MTJ stack 38 through sputtering process, it would be desirable to repeat the three steps of forming a second metal layer 94, performing an oxidation process, and performing an anneal process twice or more, or repeat the two steps of forming a second metal layer 94 and performing an oxidation process twice or more after forming the initial first metal layer 92 and then conduct an anneal process only once afterwards, which are all within the scope of the present invention. In this embodiment, the temperature of the anneal process is preferably between 200-400° C. and the duration of the anneal process is between 01-0.5 seconds.

Figure 5:
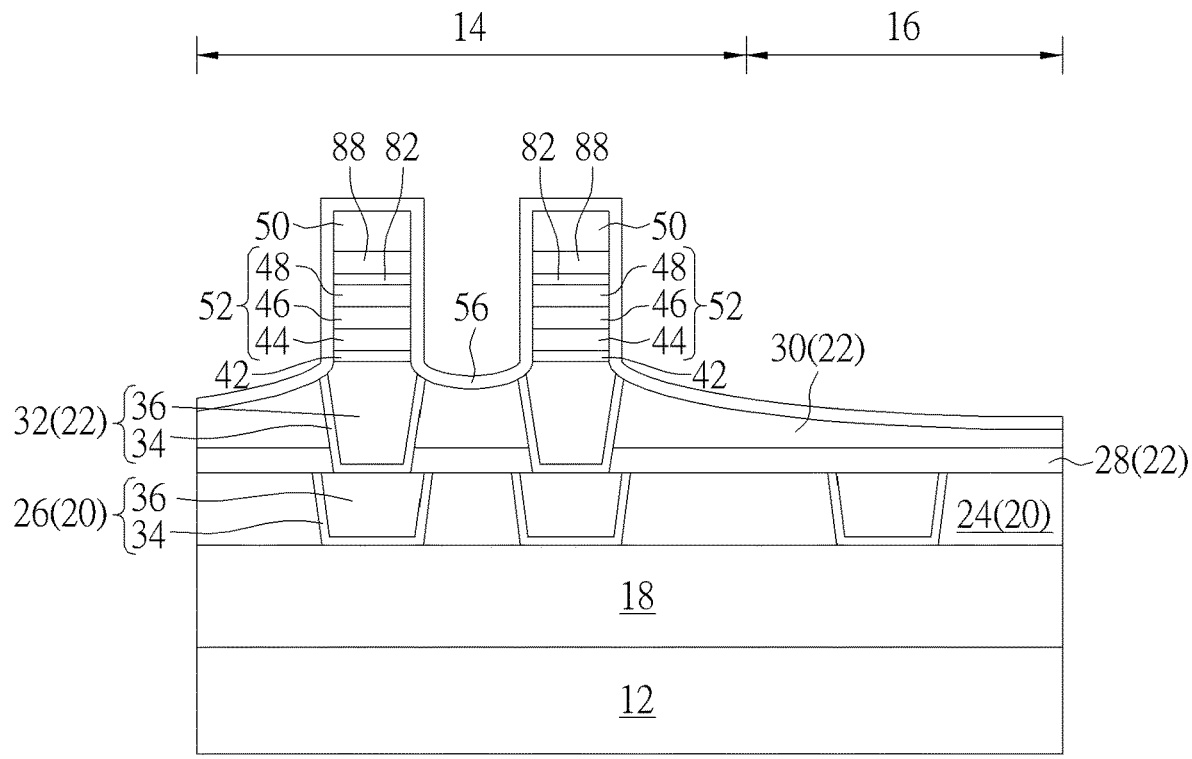

Next, as shown in FIG. 5, one or more etching process is conducted by using the patterned mask as mask to remove part of the top electrode 50, part of the cap layer 88, part of the cap layer 82, part of the MTJ stack 38, part of the bottom electrode 42, and part of the IMD layer 30 to form MTJs 52 on the MRAM region 14. It should be noted that a reactive ion etching (ME) and/or an ion beam etching (IBE) process is conducted to remove the top electrode 50, cap layers 88, cap layer 82, MTJ stack 38, bottom electrode 42, and the IMD layer 30 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer 56 is formed on the MTJs 52 and covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 6:
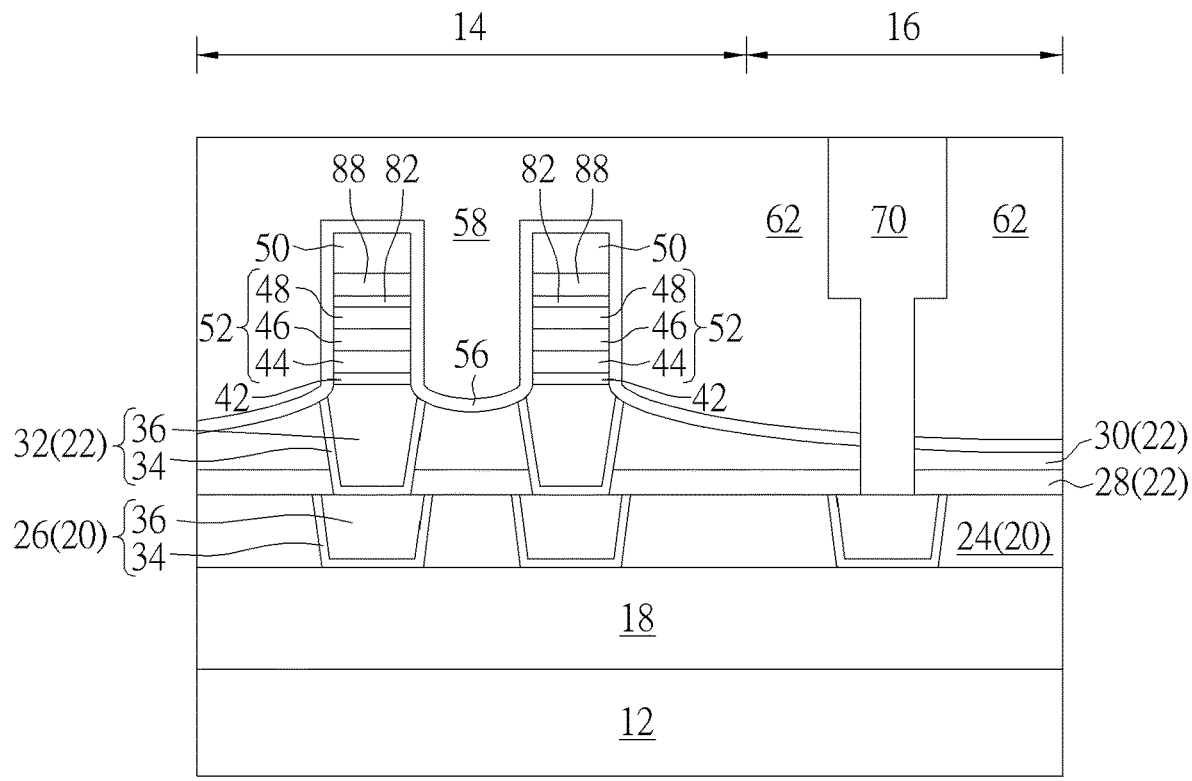

Next, as shown in FIG. 6, a flowable chemical vapor deposition (FCVD) process is conducted to form an inter-metal dielectric (IMD) layer 62 on the passivation layer 58. In this embodiment, the IMD layer 62 preferably include an ultra low-k (ULK) dielectric layer including but not limited to for example porous material or silicon oxycarbide (SiOC) or carbon doped silicon oxide (SiOCH).

Next, a pattern transfer process is conducted by using a patterned mask (not shown) to remove part of the IMD layer 62, part of the cap layer 56, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 7:
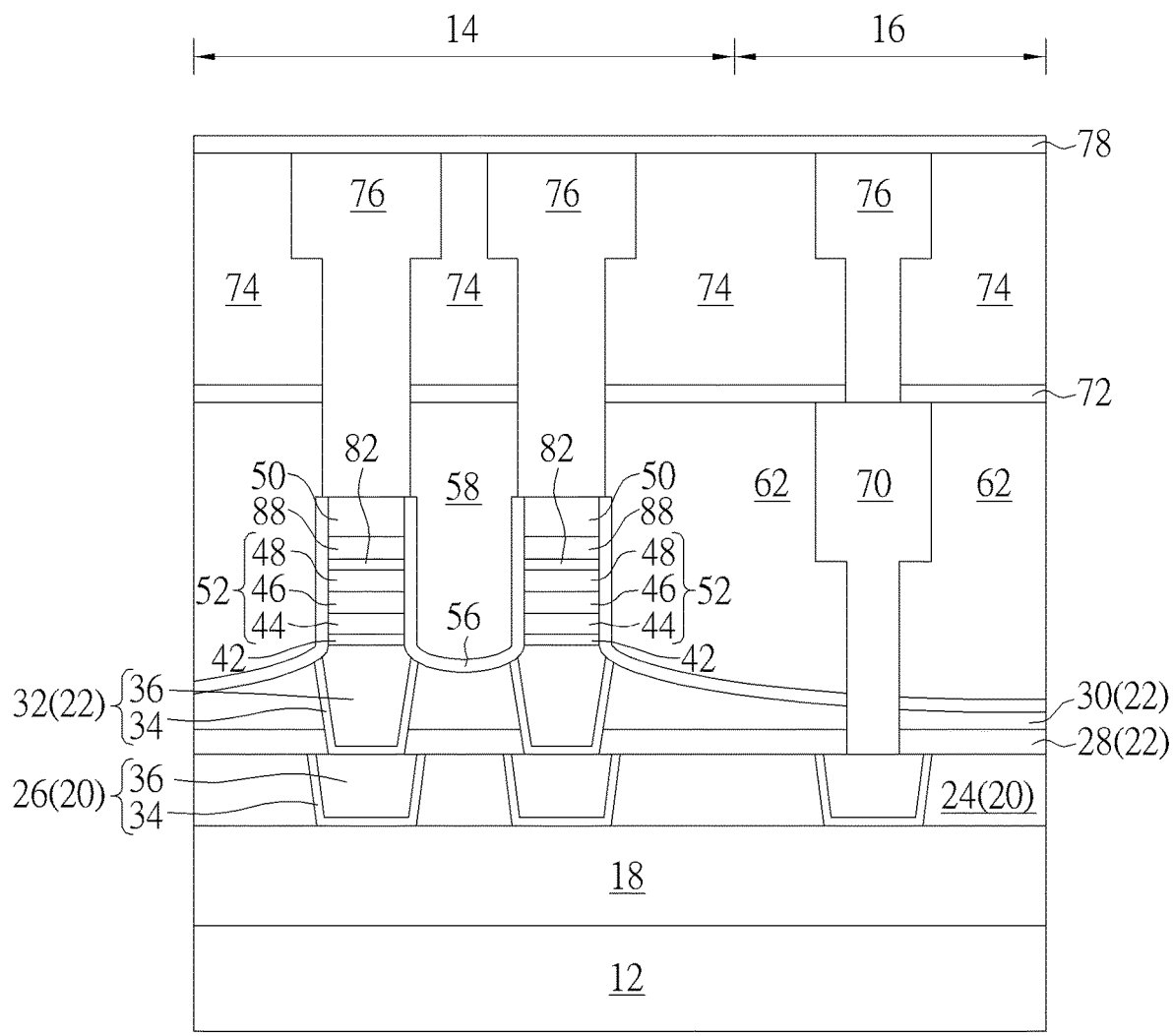

Next, as shown in FIG. 7, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, part of the IMD layer 62, and part of the cap layer 56 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, the present invention discloses an approach for fabricating a cap layer on top of MTJ, which first conducts a step (a) of forming a first metal layer on the MTJ stack 38, conducts a step (b) of forming a second metal layer on the first metal layer, and then conducts a step (c) of performing an oxidation process to convert the first metal layer and the second metal layer into a cap layer, in which after performing steps (b) and (c), steps (b) and (c) could be repeated n times while n>=2. By using this approach to fabricate the cap layer, it would be desirable to obtain a cap layer having much better flatness and lower stress thereby preventing over oxidation to the MTJ underneath.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a bottom electrode on a substrate;
   forming a cap layer of a magnetic tunneling junction (MTJ) on the bottom electrode, wherein the forming the cap layer comprises:
   (a) forming a first metal layer on the bottom electrode;
   (b) forming a second metal layer on the first metal layer; and
   (c) performing an oxidation process to transform the first metal layer and the second metal layer into the cap layer, wherein the step (b) and the step (c) are performed n times, n>=2.

2. The method of claim 1, further comprising:
   forming a pinned layer on the bottom electrode;
   forming a barrier layer on the pinned layer;
   forming a free layer on the barrier layer;
   forming the cap layer on the free layer; and
   forming a top electrode on the cap layer.

3. The method of claim 1, further comprising performing the step (b) and the step (c) at the same time.

4. The method of claim 1, wherein the first metal layer and the second metal layer comprise same material.

5. The method of claim 4, wherein the first metal layer comprises magnesium (Mg).

6. The method of claim 1, wherein a thickness of the second metal layer is less than a thickness of the first metal layer.

7. The method of claim 1, further comprising:
   (d) performing an anneal process after the oxidation process.

8. The method of claim 7, further comprising performing the steps (b), (c), and (d) n times, wherein n>=2.

* * * * *